United States Patent [19]
Sengupta et al.

[11] Patent Number: 5,766,697
[45] Date of Patent: Jun. 16, 1998

[54] METHOD OF MAKING FERROLECTRIC THIN FILM COMPOSITES

[75] Inventors: Somnath Sengupta; Louise Sengupta, both of Warwick, Md.

[73] Assignee: The United States of America as represented by the Secretary of the Army, Washington, D.C.

[21] Appl. No.: 766,704

[22] Filed: Nov. 5, 1996

Related U.S. Application Data

[62] Division of Ser. No. 569,469, Dec. 8, 1995, abandoned.

[51] Int. Cl.$^6$ ................................................. C23C 8/00
[52] U.S. Cl. ........................ 427/585; 427/255.3; 427/596
[58] Field of Search .............................. 427/585, 596, 427/248.1, 586, 255.3

[56] References Cited

U.S. PATENT DOCUMENTS

| | | | |
|---|---|---|---|
| 4,222,783 | 9/1980 | Atsumi et al. | 501/138 |
| 4,677,083 | 6/1987 | Uedaira et al. | 501/137 |
| 4,987,107 | 1/1991 | Narumi et al. | 501/138 |
| 4,987,108 | 1/1991 | Takagi et al. | 501/138 |
| 5,232,880 | 8/1993 | Wada et al. | 501/137 |
| 5,312,790 | 5/1994 | Sengupta et al. | 501/137 |
| 5,427,988 | 6/1995 | Sengupta et al. | 501/137 |
| 5,443,746 | 8/1995 | Harris et al. | 501/136 |
| 5,486,491 | 1/1996 | Sengupta et al. | 501/138 |
| 5,596,214 | 1/1997 | Endo | 257/324 |

Primary Examiner—Bernard Pianalto
Attorney, Agent, or Firm—Muzio B. Roberto

[57] ABSTRACT

A method of making ferroelectric thin film composites includes the step of providing a barium strontium titanate material with an additive magnesia-based and forming a thin film ferroelectric composite using pulsed laser deposition. The method forms a thin film composite having enhanced electronic properties.

10 Claims, 2 Drawing Sheets

CAPACITANCE VERSUS VOLTAGE FOR BSTO / 1 wt.% ALUMINA DEPOSITED ON PLATINIZED SAPPHIRE WITH Au TOP ELECTRODE.

CAPACITANCE VERSUS VOLTAGE FOR BSTO (UNDOPED) DEPOSITED ON $RuO_2$ / MgO WITH Pt TOP ELECTRODE.

CAPACITANCE VERSUS VOLTAGE FOR BSTO / 1 wt.% ALUMINA DEPOSITED ON PLATINIZED SAPPHIRE WITH Au TOP ELECTRODE.

CAPACITANCE VERSUS VOLTAGE FOR BSTO / 1 wt.% MgO DEPOSITED ON $RuO_2$ / SAPPHIRE WITH Au TOP ELECTRODE.

CAPACITANCE VERSUS VOLTAGE FOR BSTO / 1 wt.% $ZrO_2$ DEPOSITED ON $RuO_2$/ SAPPHIRE WITH Pt TOP ELECTRODE.

METHOD OF MAKING FERROLECTRIC THIN FILM COMPOSITES

This is a divisional of application Ser. No. 08/569,469, filed Dec. 8, 1995; abandoned.

This patent application incorporates the materials cited in U.S. patent application entitled "Novel Ceramic Ferroelectric Material" (Ser. No. 08/076,291 filed on Jun. 9, 1993, now U.S. Pat. No. 5,312,790), "Novel Ceramic Ferroelectric Composite Material—BSTO-ZrO$_2$," (Ser. No. 08/207,447, filed Mar. 7, 1994, now U.S. Pat. No. 5,486,497), "Novel Ceramic Ferroelectric Composite Material—BSTO-MgO" (Ser. No. 08/207,446 filed Mar. 7, 1994, now U.S. Pat. No. 5,427,988). These patent applications are commonly owned by the U.S. Government as represented by the Secretary of the Army. The invention described herein may be manufactured, used and licensed by or for the U.S. Government without payment to us of any royalty thereon.

FIELD OF THE INVENTION

The present invention is directed to a thin film and a method of making ferroelectric thin film composites and, in particular, a method utilizing pulsed laser deposition to prepare thin films comprising barium strontium titanate with an additive such as magnesium oxide, aluminum oxide or zirconium oxide.

BACKGROUND ART

Barium strontium titanate (BaTiO$_3$—SrTiO$_3$), also referred to herein as BSTO, has been known to be used for its high dielectric constant (approximate range from 200 to 6,000) in various antenna applications. This is set forth by Richard W. Babbitt et al. in their publication, "Planar Microwave Electro-Optic Phase Shifters," Microwave Journal, Volume 35 (6), (June 1992). This publication concludes that there exists a need for additional research to be conducted in the materials art to yield materials having more desirable electronic properties.

Although various types of ferroelectric composite materials are known, prior art methods of making are not conducive to the use of these types of material in ferroelectric phase shifter applications at high frequencies, e.g., 30 GHz and upwards. In these applications, it is desirable to have the ferroelectric material in a thickness of 1 micron or less. It is difficult to polish ceramics of these thicknesses and at the same time handle them properly for insertion into a given device.

As such, a need has developed for the fabrication of thin film materials having improved electronic properties which may have ideal properties with use, for example, in multi-layer capacitors, capacitor-varistors and non-volatile computer memory or for use in phased array antenna systems.

There is also a need in the multilayer ceramic capacitor market for the ability to fabricate these types of ferroelectric materials in forms that may assist in increasing the component density of the circuit. There is a growing need for miniaturization, large capacitance and low cost in this market.

In response to this need, the present invention solves the problem of fabricating these types of materials for application in miniaturized devices or in a form not requiring polishing. According to the invention, thin film ferroelectric materials can be fabricated having enhanced electronic properties.

SUMMARY OF THE INVENTION

Accordingly, it is an object of the present invention to provide a ferroelectric thin film and a method of making ferroelectric material in thin film form suitable for, but not limited to, use in phased array antenna systems. The uniqueness of this invention relative to the bulk composite patent applications cited previously lies in the fact that thin film composites of the materials described above and made according to the invention have demonstrated: (i) improved tunabilities, (ii) decreased dielectric constants, (iii) the ability to operate at higher frequency due to its reduction in thickness, and (iv) the ability to reduce the overall size of phase shifting components. It also eliminates the need of machining of the components and, therefore, is economical.

It is a further object of the present invention to fabricate a material in thin film form exhibiting enhanced electronic properties (dielectric constants, tunability, etc.).

Other objects and advantages of the present invention will become apparent as a description thereof proceeds.

In satisfaction of the foregoing objects and advantages, the present invention provides a method of making a novel thin film ferroelectric composite material having a composition comprising: barium strontium titanate, the barium strontium titanate represented as Ba$_{1-x}$Sr$_x$TiO$_3$, wherein x is greater than 0.0 but less than or equal to 0.75; and an additive selected from the group consisting of magnesia, alumina, zirconia and mixtures thereof; wherein said barium strontium titanate and said magnesia are present in effective amounts to provide a composite having a low dielectric constant, low loss tangent and high tunability.

Preferably, according to the method, the pulsed laser deposition method is used wherein the laser is a pulsed excimer laser and the method utilizes a laser wavelength of 240 nm, laser pulse energy of 220 mJ/pulse, a pulse width of 20 ns and pulse repetition rate of 10 Hz.

BRIEF DESCRIPTION OF THE DRAWINGS

Reference is now made to the drawings of the invention, wherein.

DESCRIPTION OF THE PREFERRED EMBODIMENTS

Figure 1:
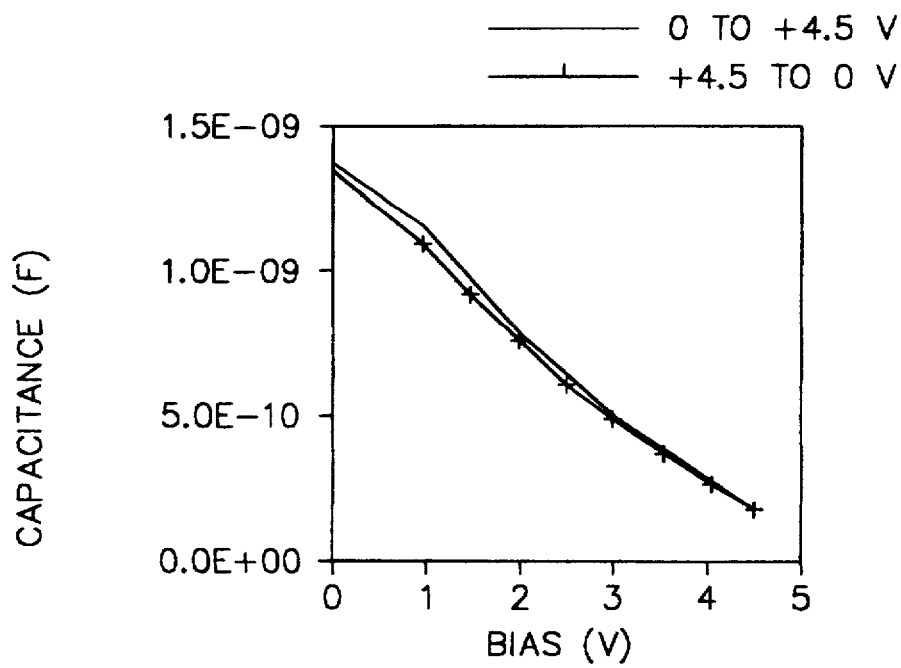
FIG. 1 plots capacitance versus voltage for a thin film of undoped barium strontium titanate.

The subject matter of the present invention is related to the fabrication of specific thin film materials which have sought—after properties in, for example, phased array antenna systems. These sought-after properties include: (1) a decreased dielectric constant; and (2) high tunability. The dielectric constant obtained is related directed to the energy storage capacity in the material; whereas, tunability may be defined as ((dielectric constant with no applied voltage)—(dielectric constant with an applied voltage))/(dielectric constant with no applied voltage). For simplicity purposes, % tunability can be represented as:

$$T = \frac{(X-Y)}{X} \times 100$$

wherein, T=k tunability, X=(dielectric constant with no applied voltage) and Y=(dielectric constant with an applied voltage).

The tunability of a material under an electric field of 7.0 KV/cm can range from 1–60% depending upon the composition of the materials employed.

The materials herein are: (a) barium strontium titanate ($BaTiO_3$—$SrTiO_3$) (hereafter referred to as BSTO), (b) BSTO combined with magnesium oxide (MgO) (hereafter referred to as BSTO/MgO), (c) BSTO combined with aluminum oxide ($Al_2O_3$) (hereafter referred to as BSTO/alumina), and (d) BSTO combined with zirconium oxide ($ZrO_2$) (hereafter referred to as BSTO/zirconia).

Although other combinations of electrically active and inactive components have been commonly employed in conjunction with piezoelectric materials, nowhere has the combination of the present invention been described. More specifically, the present invention is the first teaching wherein BSTO is combined with magnesia, in thin film form, in order to adjust the electronic properties and phase shifting ability of a material. Specifically, nowhere has BSTO been combined with magnesia, in thin film form, to adjust the electronic properties of the material for use in a phase array antenna system.

Replacing the currently employed materials with the novel ferroelectric thin film composite described in the present invention will improve the overall performance of a phased array antenna system at higher frequencies as well as reduce the cost (1/25 of the cost of a ferrite element presuming a 5000 element array), weight and size of the antenna per se.

The present invention encompasses the fabrication of novel thin film materials having enhanced electronic properties. These materials are superior to other currently employed thin film ferroelectric materials.

When one considers the optimization in the electronic properties of ceramic materials, the following parameters must be taken into consideration:

(1) Dielectric Constant: Ideally the dielectric constant should be low, ranging from approximately 30 to 1,500. This dielectric constant range does not decrease the phase shifting ability of the material if a sufficient thickness of the thin film material is used (then a high dielectric constant is not needed). As insertion loss (loss of energy getting into the thin film) does not depend upon the dielectric constant, it is not affected by lowering the dielectric constant. Also, since the loss tangent (tan $\delta$) increases with increasing dielectric constant (for these ferroelectric materials), lower dielectric materials tend to have lower loss tangents and therefore, less insertion loss.

(2) High Tunability: The tunability of a particular material affects the material's electronic properties by how much the dielectric constant changes with applied voltage. The degree of phase shifting ability is directly related to the tunability; therefore, higher tunabilities are desired. The tunability can be increased in the case of thin film materials by depositing thinner sub-micron layers of the materials. The insertion loss is inversely related to the tunability so that the larger the tunability, the smaller the insertion loss. Optimum electronic properties would have tunabilities ranging from 4 to 50% (depending upon the dielectric constant and the loss tangent).

(3) Low Loss: The loss tangent (intrinsic to the material) serves to dissipate or absorb the incident microwave energy and therefore is most effective in this device when the loss tangent is in the range of 0.001 or less. The low loss tangent serves to decrease the insertion loss and hence increase the phase shifting per decibel of loss. The operating frequency is controlled by the loss tangent.

The materials within the scope of the present invention fall within the optimum characteristics outlined above. These materials, for example, are $Ba_{1-x}Sr_xTiO_3$-MgO, wherein x is greater than 0.0 but less than or equal to 0.75. This formulation may be referred to as barium strontium titanate and magnesia. The weight ratios of barium strontium titanate (BSTO) to magnesia may range from 99% wt.–40% wt. BSTO to 1% wt.–60% wt. magnesia. A typical composition within the present invention may comprise 99% by weight BSTO (wherein x=0.35) and 1% by weight magnesia (MgO). This composition has a dielectric constant of 398, and a tunability of 79 (typically applied electric field—2.3 V/μm). The above-mentioned compositional variations are true also for the BSTO/Alumina and BSTO/Zirconia composites.

Magnesia is used herein to adjust the electronic properties of BSTO. The electronic properties of the formulation herein can be adjusted for use in any discrete element phase shifter design, such as planar microstrip, wave guide geometries or for use in a parallel plate structure.

It has been found that the electronic properties of BSTO-magnesia are reproducible to within 5%. Hence, once a specific formulation of BSTO-magnesia is determined to be suitable for a specific purpose, the composition can be reproduced within 5% accuracy.

The preparation of BSTO-magnesia thin films may be accomplished by preparing a ceramic disc of the appropriate composition for subsequent use of that disc as the ablation target for depositing the thin film onto the desired substrate under the proper deposition conditions utilizing the pulsed laser deposition method. If the antenna application does not require exceedingly high tunability (where tunability can be increased with a decrease in sample thickness for a given externally applied electric field), then the compositions with lower dielectric constants are probably likely to produce less impedance mismatch and may possess lower loss tangents.

EXAMPLE 1

This example will describe a typical thin film deposition procedure. The single crystal substrates (obtained commercially) are cleaned in trichloroethylene, followed by two rinses with isopropyl alcohol. Following the degreasing, the substrates are air dried. The substrate and the target are then mounted in the vacuum deposition chamber. Table I lists the laser characteristics used for the experiments.

TABLE I

| Laser | Krypton Fluoride excimer laser |
| --- | --- |
| Wavelength | 248 nm |
| Pulse energy | 220 mJ/pulse |
| Pulse width | 20 ns |
| Pulse repetition rate | 10 Hz |

Table II illustrates the thin film deposition conditions.

TABLE II

| Substrate temperature | 450° C. |
| --- | --- |
| Substrate to target distance | 50 mm |
| Oxygen backfill pressure | 100 mT |

Under the above-mentioned conditions, the typical deposition rate was about 0.2 Å/pulse. After the films were deposited, they were investigated through glancing angle x-ray diffraction in order to confirm their orientation and composition. The composition of the films were also verified by Rutherford backscattering spectrometry. The results indicated that the films are preferentially oriented and were stoichiometrically similar to the ablation target. It should be understood that Example 1 is not limiting to the scope of the invention and other process variables could be used as are known to the artisan.

Preferred ranges for the variables used in the example include:

Wavelength: 193 nm–248 nm

Pulse energy: 200 mJ/pulse to 350 mJ/pulse

Pulse width: 10 ns–20 ns

Pulse repetition rate: 5 Hz–25 Hz

Substrate temperature: 400° C.–700° C.

Substrate to target distance: 25 mm–50 mm

Oxygen backfill pressure: 50 mT–100 mT.

Electronic Measurements

The electronic characterization of the films were performed by measuring the capacitance versus voltage (C-V) characteristics of the films at 30 KHz with a HP 4194 A Impedance analyzer. FIG. 1 shows the capacitance versus voltage characteristics for the BSTO (undoped) film deposited on $RuO_2$/MgO. The curve shows a symmetric capacitance-voltage relationship which is characteristic of paraelectric films. The dielectric constant at zero bias was calculated to be 1474 and the tunability is 88% at a field of 7.5 V/μm. Any porosity and/or leakage current in the films will tend to decrease the dielectric constants obtained.

Figure 2:
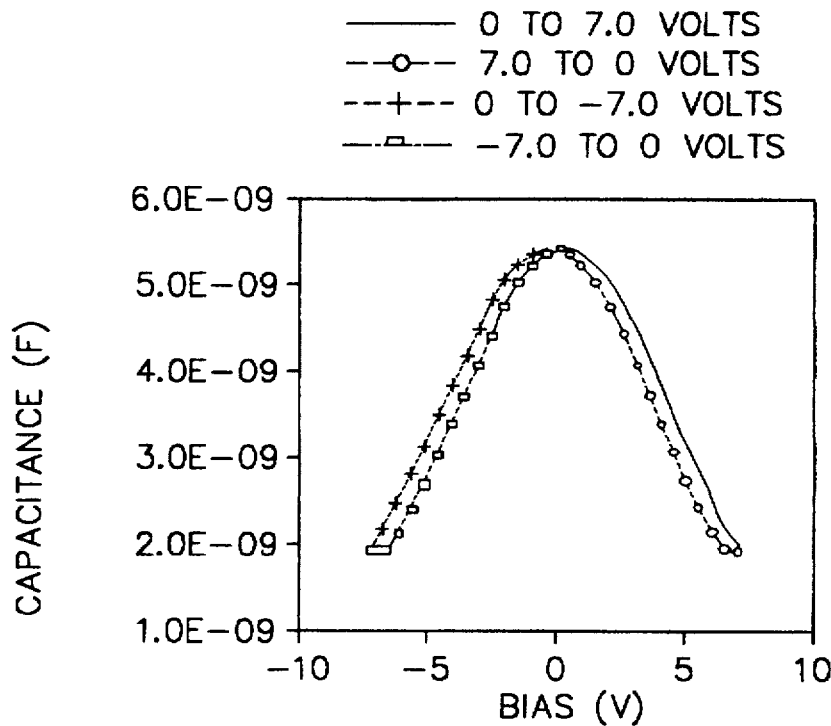
FIG. 2 plots capacitance versus voltage for a thin film of barium strontium titanate with 1 wt % alumina.

The C-V curve for the BSTO/1 wt. % alumina film deposited on platinized sapphire is shown in FIG. 2. The curve shows a typical paraelectric behavior, (i.e., a symmetric capacitance), with positive and negative bias applied. The dielectric constant at zero voltage calculated form this curve is 189. The tunability obtained with up to 6.3 V/μm was 40%.

Figure 3:
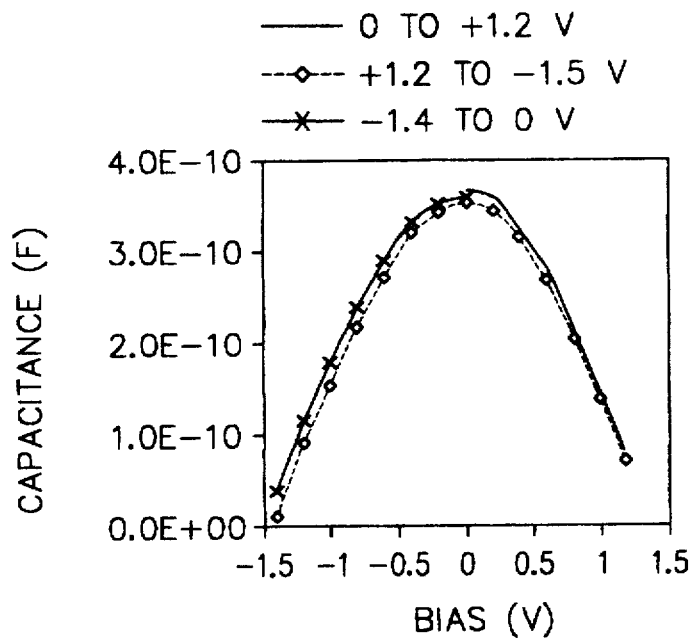
FIG. 3 plots capacitance versus voltage for a thin film of barium strontium titanate with 1 wt % MgO.

The capacitance versus voltage for the BSTO/1 wt. % MgO film deposited on $RuO_2$/sapphire is shown in FIG. 3. Thus curve also shows the typical paraelectric behavior of symmetric capacitance versus voltage behavior. The value for the zero voltage dielectric constant is 398 and the tunability is 79% at 2.0 V/μm.

Figure 4:
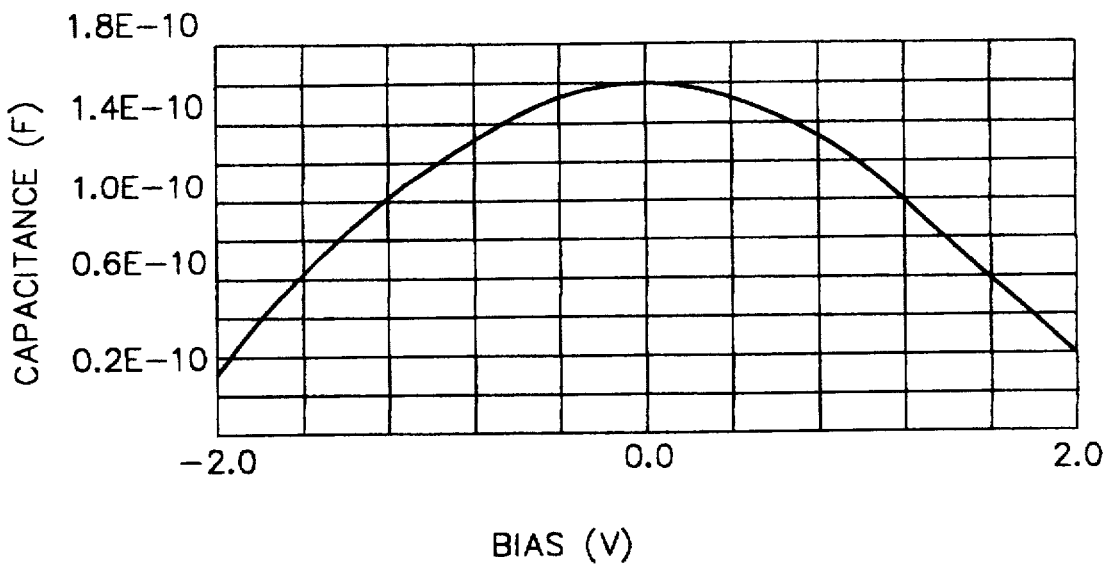
FIG. 4 plots capacitance versus voltage for a thin film of barium strontium titanate with 1 wt % ZrO$_2$.

The capacitance versus voltage for the BSTO/1 wt. % $ZrO_2$ film deposited on $RuO_2$/sapphire is shown in FIG. 4. This curve also shows the typical paraelectric behavior of symmetric capacitance versus voltage behavior. The value for the zero voltage dielectric constant is 600 and the tunability is 34% at 2.5 V/μm.

While particular embodiments of the present invention have been shown and described, it will be obvious to those skilled in the art that changes and modifications may be made without departing from this invention. For example, the invention may be modified to include thin film composites of BSTO and other low dielectric constant materials depending upon the particular requirements of the intended application. Among some of the other low dielectric constant materials which may be combined with BSTO are combinations of magnesia, zirconia, and alumina in separate dopant levels or in composite form, silicon dioxide and other low dielectric constant materials which may be combined with BSTO are combinations of magnesia, zirconia, and alumina in separate dopant levels or in composite form, silicon dioxide and other low dielectric constant, low dielectric loss oxides. Furthermore, two or more of these oxides may be co-ablated to form specific combinations of compositions in order to tailor the properties of these thin films depending upon the requirement.

It is therefore intended that the claims herein are to include all such obvious changes and modifications as fall within the true spirit and scope of this invention.

We claim:

1. A method of making a thin film of a ferroelectric composite material having a composition comprising:

barium strontium titanate, said barium strontium titanate represented as $Ba_{1-x}Sr_xTiO_3$, wherein x is greater than 0.0 but less than or equal to 0.75, and an additive selected from the group consisting of mangesia, alumina, silica, a low dielectric oxide, zirconia, and combinations thereof; wherein said barium strontium titanate and said additive are present in effective amounts to provide a composite having a low dielectric constant, low loss tangibles, and high tunability.

the method comprising the steps of:

a) providing at least one ceramic disc of said composition as an abalation target;

b) providing a substrate at a temperature of between 400–700 degrees centigrade, and at a distance between the substrate and target of 25–50 mm;

c) depositing a thin file of said composition on said substrate using a krypton exciminer pulsed laser utilizing a laser wavelength of 193–248 nm, a laser pulse energy of 226–350 m/J pulse, a pulse width of 10–20 ns and a pulse repetition rate of 5–25 Hz.

2. The thin film ferroelectric composite material of claim 1, wherein said barium strontium titanate is $Ba_{1-x}Sr_xTiO_3$, wherein x=0.35 to 0.40.

3. The thin film ferroelectric composite material of claim 2, wherein the weight ratio of said barium strontium titanate to said additive ranges from approximately 99%–50% barium strontium titanate to approximately 1%–60% additive.

4. The thin film ferroelectric composite of claim 1 wherein said additive is magnesia.

5. The thin film ferroelectric composite of claim 4 wherein said magnesia is about 1%.

6. The thin film ferroelectric composite of claim 1 wherein said additive is alumina.

7. The thin film ferroelectric composite of claim 6 wherein said alumina is about 1%.

8. The thin film ferroelectric composite of claim 1 wherein said additive is zirconia.

9. The thin film ferroelectric composite of claim 8 wherein said zirconia is about 1%.

10. The method of claim 1 wherein a plurality of ceramic discs are used, said plurality making up said composition in total.

* * * * *